United States Patent
Cheong

(10) Patent No.: US 6,818,537 B2
(45) Date of Patent: Nov. 16, 2004

(54) METHOD OF MANUFACTURING A CONTACT PLUG FOR A SEMICONDUCTOR DEVICE

(75) Inventor: Woo Seock Cheong, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 0 days.

(21) Appl. No.: 10/034,504

(22) Filed: Dec. 28, 2001

(65) Prior Publication Data

US 2003/0068882 A1 Apr. 10, 2003

(30) Foreign Application Priority Data

Oct. 8, 2001 (KR) ......................................... 2001-61887

(51) Int. Cl.[7] .............................................. H01L 21/28
(52) U.S. Cl. ....................... 438/586; 438/637; 438/641; 438/657; 438/675; 438/677; 438/680; 438/684; 438/700; 438/745
(58) Field of Search ................................ 438/657, 675, 438/677, 680, 684, FOR 351, 233, 586, 637, 641, 674, 700, 745, 778, FOR 196, FOR 388, FOR 395

(56) References Cited

U.S. PATENT DOCUMENTS

| | | | |
|---|---|---|---|
| 4,898,841 A | * | 2/1990 | Ho |
| 5,073,516 A | | 12/1991 | Moslehi |
| 5,273,921 A | | 12/1993 | Neudeck et al. |
| 5,321,306 A | | 6/1994 | Choi et al. |
| 5,434,092 A | | 7/1995 | Neudeck et al. |
| 5,604,368 A | | 2/1997 | Taur et al. |
| 5,663,085 A | * | 9/1997 | Tanigawa |
| 5,804,470 A | | 9/1998 | Wollesen |
| 5,837,582 A | * | 11/1998 | Su |
| 5,895,948 A | | 4/1999 | Mori et al. |
| 5,918,123 A | * | 6/1999 | Yang |
| 5,955,759 A | | 9/1999 | Ismail et al. |
| 6,030,891 A | | 2/2000 | Tran et al. |
| 6,030,894 A | | 2/2000 | Hada et al. |
| 6,046,083 A | * | 4/2000 | Lin et al. |
| 6,046,084 A | * | 4/2000 | Wei et al. |
| 6,071,783 A | * | 6/2000 | Liang et al. |
| 6,074,925 A | * | 6/2000 | Aisou |
| 6,090,691 A | | 7/2000 | Ang et al. |
| 6,150,190 A | | 11/2000 | Stankus et al. |
| 6,346,732 B1 | * | 2/2002 | Mizushima et al. |
| 6,383,863 B1 | * | 5/2002 | Chiang et al. |
| 2002/0024082 A1 | * | 2/2002 | Tsunashima et al. |

FOREIGN PATENT DOCUMENTS

| | | |
|---|---|---|
| JP | 59082768 | 5/1984 |
| JP | 59165461 | 9/1984 |
| JP | 59165462 | 9/1984 |
| JP | 59165463 | 9/1984 |
| JP | 59165464 | 9/1984 |
| JP | 59165465 | 9/1984 |
| JP | 59189677 | 10/1984 |
| JP | 61006195 | 1/1986 |
| JP | 61164355 | 7/1986 |
| JP | 2130919 | 5/1990 |
| JP | 7130682 | 5/1995 |
| JP | 107219 | 4/1998 |

* cited by examiner

Primary Examiner—George Fourson
Assistant Examiner—Joannie Adelle Garcia
(74) Attorney, Agent, or Firm—Ladas & Parry LLP

(57) ABSTRACT

A method of manufacturing a semiconductor device comprising the steps of forming an insulating layer on a silicon substrate, forming a contact hole on the insulating layer, forming a silicon layer on the surface of the contact hole, and forming a selective conductive plug in the contact hole having the silicon layer.

24 Claims, 9 Drawing Sheets

METHOD OF MANUFACTURING A CONTACT PLUG FOR A SEMICONDUCTOR DEVICE

BACKGROUND OF THE INVENTION

1. Field of the Invention

The present invention relates generally to a method of manufacturing a semiconductor device, and more particularly, to a method of manufacturing a semiconductor device capable of forming a contact plug suitable for highly-integrated semiconductor devices.

2. Description of the Related Art

As is well known, silicon epitaxial growth (SEG) can be advantageously applied to semiconductor devices to decrease cell size, to simplify the manufacturing process and to improve the electrical properties of the device.

According to conventional methods, a silicon contact plug is formed by forming a contact hole and depositing amorphous silicon in the contact hole and then, performing planarization using a CMP process.

Thereby, a plug can be formed by using the selective epitaxial growth in order to solve problems such as gap-fill and contact resistance due to decrease of cell size. Moreover, by this conventional method it is not required to perform a CMP or silicon recess etch for plug isolation, thereby simplifying the process.

However, there are several problems to solve in applying the selective epitaxial growth (SEG).

First, there is the problem of selectivity in a pattern material (a material forming a window for SEG). That is, when a self-aligned contact (SAC) etch scheme is applied to provide a sufficient cell activation area, the surface of the nitride layer is exposed.

Furthermore, the SEG has different aspects of defects and facet generation due to the selectivity and thermal stress of the pattern material.

Generally, in LPCVD, the nitride material has difficulty in having selectivity at a temperature below 850° C., as compared with an oxide material. Therefore, growth speed is lowered to have selectivity, thereby increasing thermal growth.

The conventional method is described in more detail with reference to the accompanying drawing figures in which FIGS. 1 to 4 are cross sectional views showing the steps of a conventional method for manufacturing semiconductor device.

Referring to FIG. 1, a gate electrode 3 is formed on a silicon substrate 1 and a sidewall spacer 5 is formed on the side of the gate electrode 3.

Then, although it is not shown in the drawings, impurity junction regions are formed by implanting impurities on the lower part of both sides of the sidewall spacer 5 on the silicon substrate 1.

An interlayer insulating layer 7 is deposited over the silicon substrate 1, including over the gate electrode 3 and the sidewall spacer 5.

Referring to FIG. 2, a plug contact hole 9 is formed to expose the impurity junction region (not shown) by performing a mask formation process using a lithography process and a patterning process on the interlayer insulating layer 7.

Referring to FIG. 3, an amorphous silicon layer 11 is deposited to fill the plug contact hole 9 on the upper part of the interlayer insulating layer 7, including the plug contact hole 9.

Referring to FIG. 4, the amorphous silicon layer 11 is etched by using chemical mechanical polishing (CMP) or a silicon recess etch process, thereby forming a contact plug 11a, which is electrically in contact with the impurity junction region (not shown) in the plug contact hole 9.

However, the conventional method has several problems, particularly in manufacturing a contact hole and a contact plug having a high aspect ratio, wherein a circuit line width is below a specified lower limit, for example, 0.16 μm.

According to the conventional method, in order to form a plug with silicon, it is required to perform a CMP on the oxide layer, contact hole formation, amorphous silicon deposition and plug isolation, using a CMP or silicon reset etch. Therefore, a problem arises in that these processes result in high production costs.

Furthermore, it is difficult to prevent the generation of natural oxide layers on the interface of the cell and plug since in-situ cleaning is not performed in a tube type LPCVD. Therefore, contact resistance of polycrystalline silicon is increased by three times more than when using selective epitaxial growth (SEG).

There is an additional problem of gap-fill in silicon deposition due to the reduced contact hole size and increase of aspect ratio.

Moreover, compared with SEG, phosphorus diffusion is increased in a highly doped amorphous or polycrystalline silicon, thereby deteriorating the cell properties.

Although it is not shown in the drawings, another, alternative embodiment of the conventional method will be described in the following description.

According to the alternative embodiment, an interlayer insulating layer (not shown) is first deposited using a nitride material on a silicon substrate (not shown) having a gate electrode and an impurity junction region.

Then, a contact hole (not shown) is formed to expose the impurity junction region (not shown) by selectively patterning the interlayer insulating layer (not shown).

Subsequently, a SEG plug is formed in the contact hole (not shown) to maintain selectivity with the interlayer insulating layer (not shown) pattern of nitride material.

This embodiment has the advantages of reducing contact resistance and simplifying the formation process by selective epitaxial growth.

However, when a LPCVD method is applied to the conventional method, HCl is increased in order to maintain selectivity on the surface of nitride layer, thereby lowering the growth speed of SEG.

The nitride material has a thermal coefficient of expansion (TCE) higher than that of the silicon, thereby generating defects when using SEG due to the difference in thermal expansion.

It is also difficult to obtain process margin on the surface of the nitride layer in a UVH-CVD method.

Moreover, in the nitride layer pattern, regions having selectivity are decreased by ten times as compared to an oxide layer, at temperatures below 900° C.

When the SEG is formed, the nitride pattern has a generation rate of defects higher than that of the oxide layer.

Furthermore, it is difficult to maintain the selectivity of the nitride layer in-situ, thereby lowering the growth speed.

As a result, thermal budget of SEG is increased and device properties deteriorate.

Moreover, overgrowth of SEG may occur according to the density and shape of the cell pattern, thereby generating problems of CMP on the interlayer insulating layer.

SUMMARY OF THE INVENTION

The present invention has been made to solve the above problems. One object of the present invention is to provide a method of manufacturing a semiconductor device capable of forming an improved contact plug suitable for highly integrated semiconductor devices.

Another object of the present invention is to provide a method of manufacturing a semiconductor device capable of simplifying the manufacturing process of the semiconductor device by using SEG in forming the plug.

Yet another object of the present invention is to provide a method of manufacturing a semiconductor device capable of reducing the contact resistance of the plug in forming the contact plug.

Still another object of the present invention is to provide a method of manufacturing a semiconductor device capable of reducing production costs by minimizing the amount of silicon source for the gap fill of the silicon plug.

And, still another object of the present invention is to provide a method of manufacturing a semiconductor device capable of minimizing the processing time of the plug by increasing the growth speed of silicon on the sidewall of the contact hole.

In order to accomplish the above objects, the present invention comprises the steps of: forming an insulating layer on a silicon substrate; forming a contact hole on the insulating layer; forming a silicon layer on the surface of the contact hole; and forming a selective conductive plug in the contact hole, having the silicon layer.

The above objects, and other features and advantages of the present invention will become more apparent after reading the following detailed description when considered in conjunction with the drawings.

DETAILED DESCRIPTION OF THE INVENTION

Figure 1:
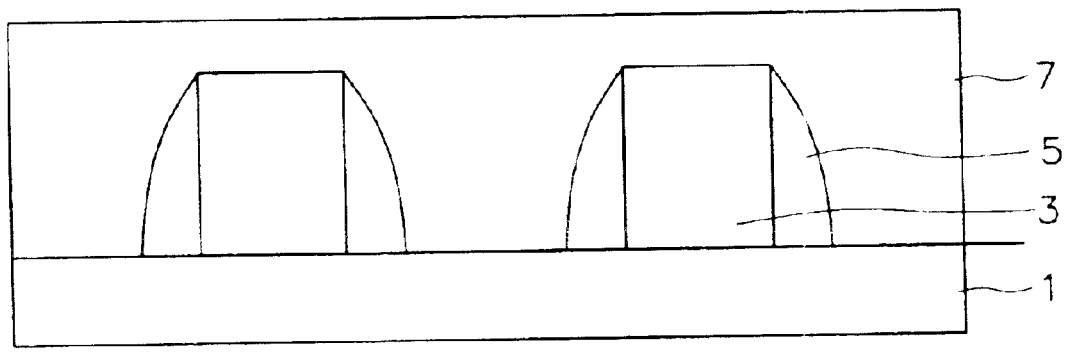
FIGS. 1 to 4 are cross sectional views showing the steps of a conventional method of manufacturing a semiconductor device.
Figure 2:
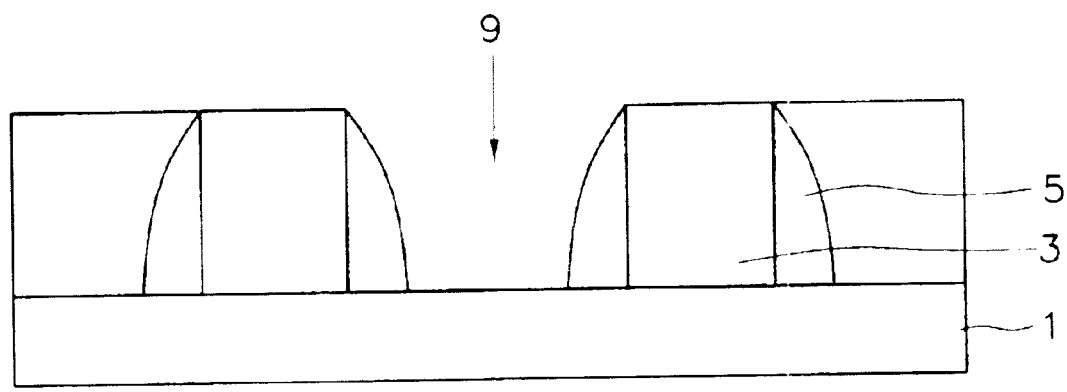
Figure 3:
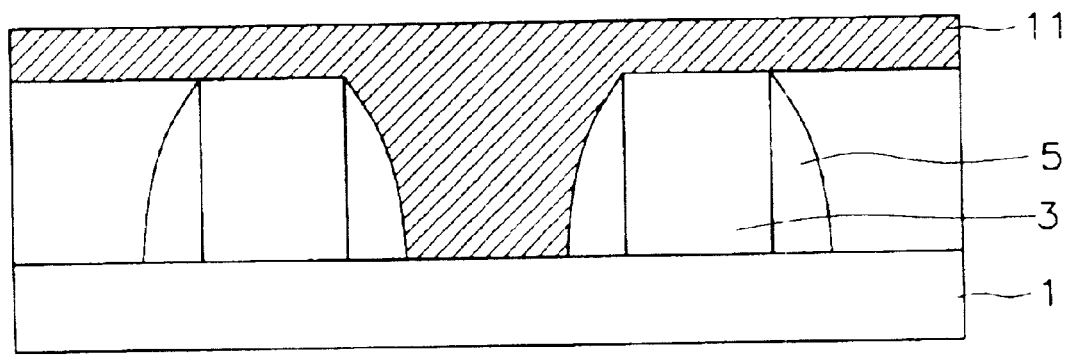
Figure 4:
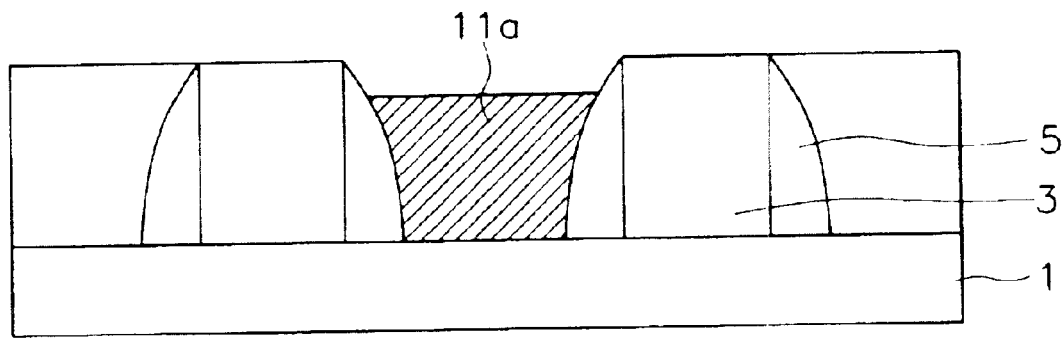
Figure 5:
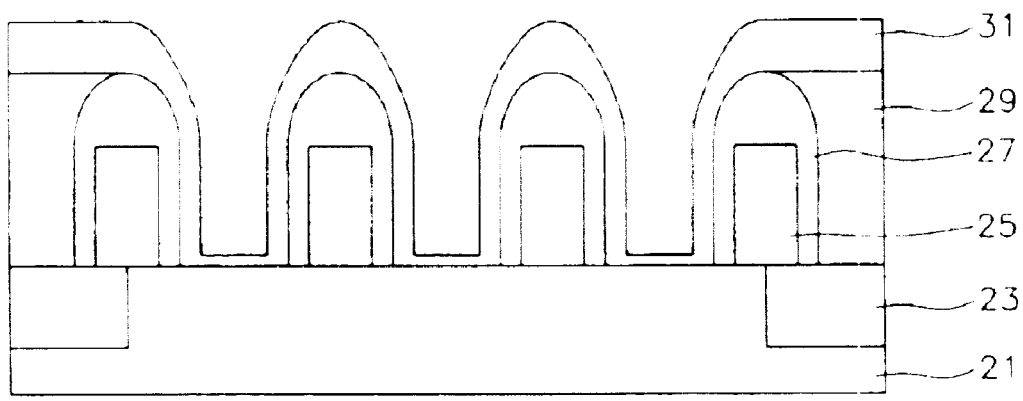
FIGS. 5 to 9 are cross sectional views showing the steps of a method of manufacturing a semiconductor device according to an embodiment of the present invention.

Referring now to FIG. 5, a trench isolation layer 23 is formed on a silicon substrate 21 to define a device formation region and a device isolation region.

A gate insulating layer (not shown) and a gate structure 25 are then formed on the device formation region of the silicon substrate 21 and a nitride layer (not shown) is deposited on the upper part of the silicon substrate 21, including over the gate structure 25. Subsequently, this nitride layer is selectively removed by using an anisotropic etch process, so that the upper part and side part of the gate structure 25 remain, thereby forming an insulating layer spacer 27.

Although it is not shown in the drawings, impurity junction regions (not shown) are formed by implanting impurities on the lower parts of both sides of the insulating layer spacer 27 on the silicon substrate 21.

An insulating layer 29 is then deposited on the resulting structure, including over the insulating layer spacer 27, and the layer is selectively patterned to form a contact hole (not shown) exposing the silicon substrate 21 on the lower part of the insulating layer spacer 27.

Then, a PE-USG oxide layer 31 is deposited to a thickness of between 300 to 1000 Å on the resulting structure, including over the insulating layer spacer 27. Here, step coverage is required to be maintained below 50%. The source gas of the PE-USG oxide layer 31 is one or more gas taken from a group comprising of $SiH_4$, $N_2O$ and He, at a pressure of between 0.1 to 50 Torr, a temperature of between 350 to 550° C., and a power level between 100 to 1000W.

Figure 10:
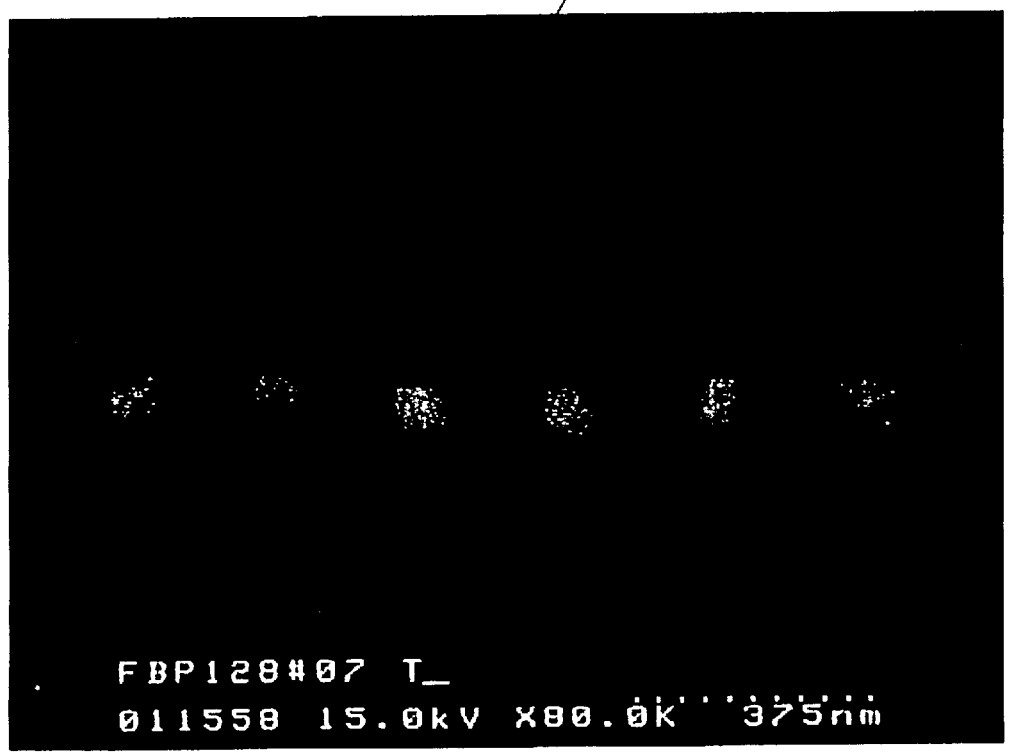
FIG. 10 is a TEM photograph showing a cross section having a plasma enhanced undoped silicate glass (PE-USG) layer according to an embodiment of the present invention.

FIG. 10 is a photograph showing a cross section of the PE-USG oxide layer at a temperature of 420° C. As shown in the drawing, the step coverage is approximately 30%.

As described above, it is possible to reduce losses of the gate hard mask by forming the PE-USG oxide layer 31 on the gate structure 25.

Figure 6:
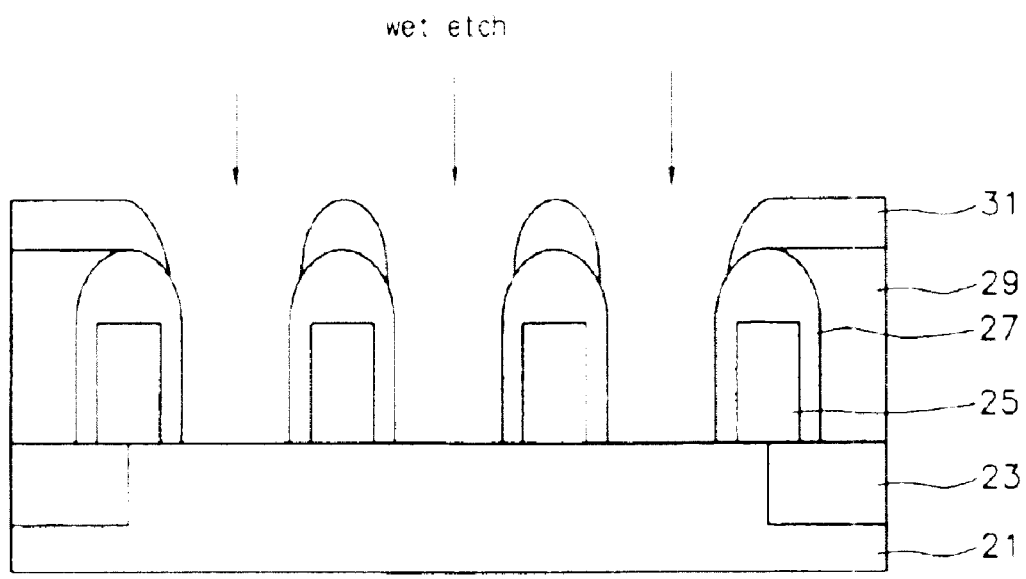

Referring to FIG. 6, the PE-USG oxide layer 31 is selectively removed by using wet a etch process, as shown, but retaining the oxide layer 31 on the upper part of the nitride layer spacer 27, to a remaining depth of between approximately 200 and 400 Å, thereby exposing the surface of the silicon substrate 21 between the nitride layer spacer 27. The etch process of the PE-USG oxide layer 31 is performed at a temperature of between 50 and 100° C. in distilled water (DI), between 50 and 500 times, by using a diluted HF solution. For example, when a PE-USG layer having a step coverage of 50% is deposited to a thickness of 600 Å, the wet etch target is between 300 to 400 Å.

Then, an in-situ cleaning process is performed prior to deposition of the amorphous silicon layer. The in-situ cleaning process is performed to remove the oxide layer on the substrate interface by raising the temperature in a state of hydrogen flow. It is desirable to perform the cleaning process by using a Rapid Thermal Processing (RTP) method in consideration of processing time and thermal budget. The RTP method is performed by instantaneously raising the temperature to 950° C. (the ramping rate being over 10° C./sec) and then, rapidly cooling to the temperature of the silicon deposition, that is, to between 550 and 630° C.

Figure 7:
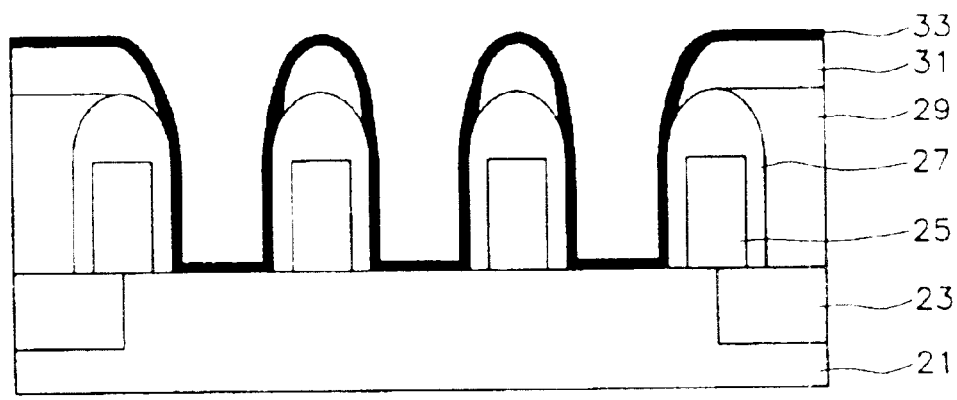

Referring to FIG. 7, a doped amorphous silicon layer 33 is deposited to a thickness of between 50 and 150 Å on the upper part of the resulting structure, including over the PE-USG oxide layer 31, after the cleaning process. The deposition of the doped amorphous silicon layer 33 is performed by using either $SiH_4$ or $H_2$ as a processing gas and the silicon doping concentration is approximately between 1 to $2 \times 10^{20}$ atom/cc.

Figure 11:
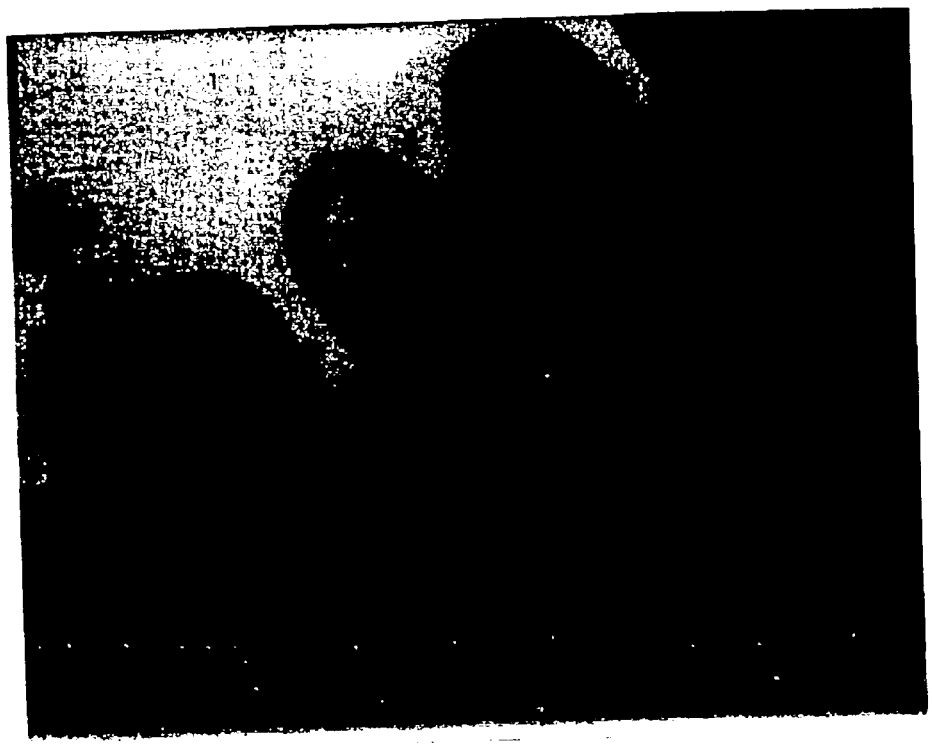
FIG. 11 is a TEM photograph showing a cross section having a doped amorphous silicon layer after a wet etch process.

The doped amorphous silicon layer 33 is deposited in the range of critical temperatures, thereby forming a doped polycrystalline silicon on the surface of exposed nitride layer spacer 27 as shown in FIG. 11. Thereby, the growth speed is increased by 20 to 50%.

Figure 8:
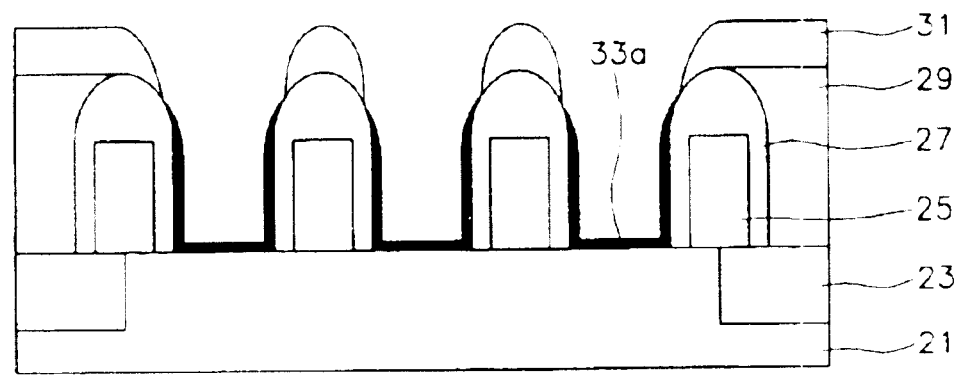

Referring to FIG. 8, the temperature is raised to the formation temperature of selective silicon growth (SSG) and the amorphous silicon layer 33 on the PE-USG layer 31 is removed by flowing HCl and H$_2$ in a gas-stabilization step. In the process, the flow rate of HCl is between 0.1 and 1 slm, that of H$_2$ is between 1 and 10 slm, the pressure is between 10 and 500 Torr, and the temperature is between 750 and 950° C.

A silicon layer 33a remains on the side of the nitride layer spacer 27 and on the bottom of the silicon substrate 21. Interface cleaning is performed on the bottom of the silicon substrate 21, thereby maintaining epitaxial contact.

According to the above process, growth uniformity of the selective silicon plug is remarkably improved and moreover, it is unnecessary to perform a plug isolation process.

Figure 9:
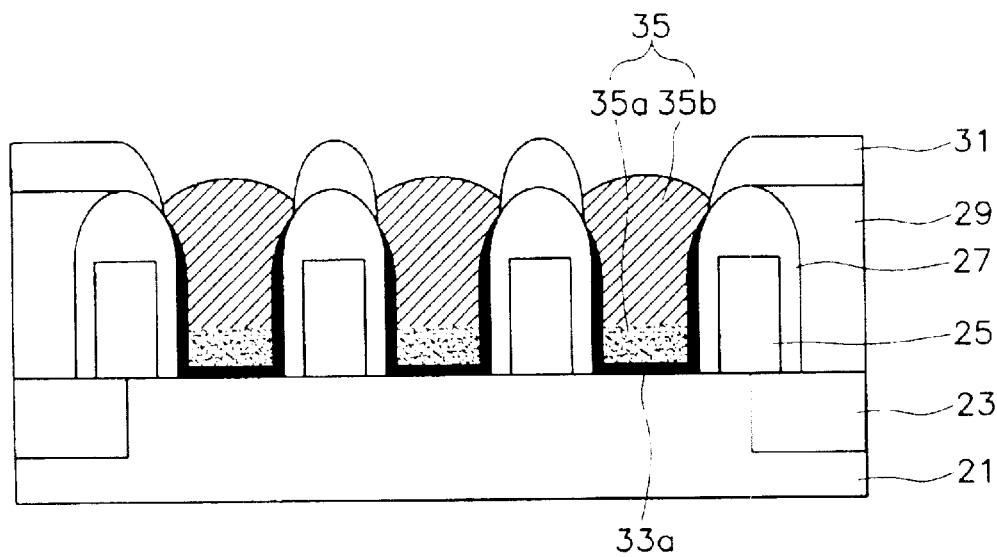

Referring to FIG. 9, a selective silicon plug 35 is grown in the contact hole (not shown), including over the silicon layer 33a, by using a LPCVD method. In the LPCVD method, a DCS—H$_2$—HCl gas system or MS—H$_2$—HCl gas system is applied, similar to that of a Si—H—Cl system.

When the DCS—H$_2$—HCl gas system is applied, the temperature is between 750 and 950° C., the pressure is between 5 to 150 Torr, the flow rate of DCS is between 0.1 and 1.0 slm, the flowrate of HCl is between 0.1 and 1.0 slm, and the flowrate of H$_2$ is between 30 and 150 slm.

When the MS—H$_2$—HCl gas system is applied, the temperature is between 750 and 950° C., the pressure is between 5 and 150 Torr, the flow rate of MS is between 0.1 and 1 slm, the flowrate of HCl is between 0.5 and 5.0 slm, and the flowrate of H$_2$ is between 30 and 150 slm.

In both cases, 1 to 10% PH$_3$/H$_2$ is flowed at between 0.1 and 1.5 slm for in-situ doping process. The SEG growth target is between 60 and 100% of the width of gate distance. For example, when a width of gate distance is 1000 Å, the SEG growth target is between 600 and 1000 Å.

Figure 12:
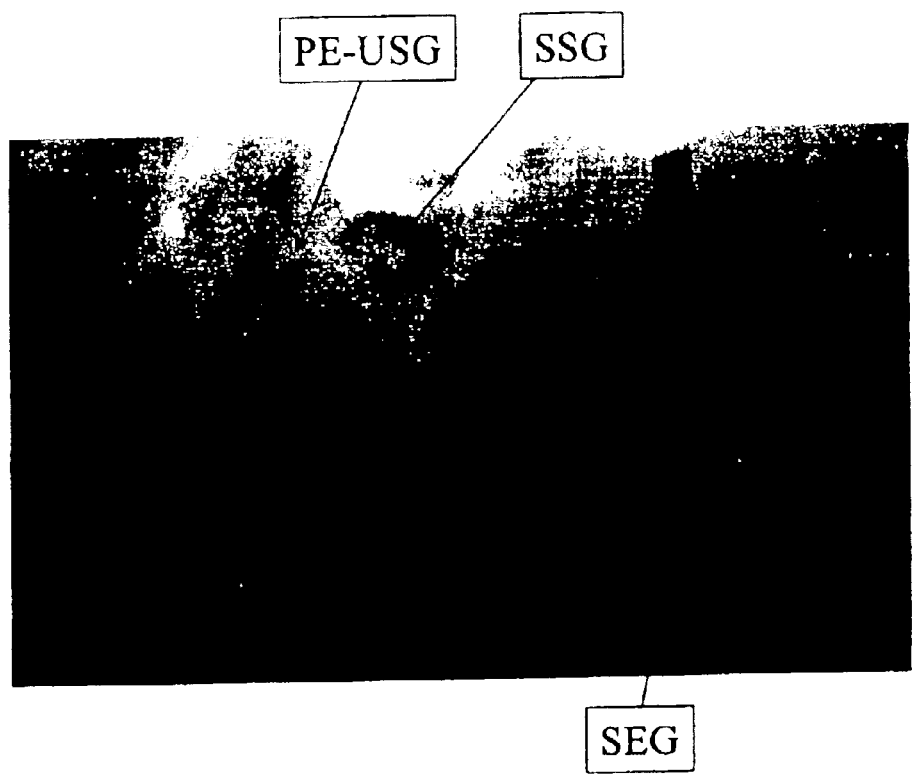
FIG. 12 is a TEM photograph showing a cross section having SEG and SSG according to an embodiment of the present invention.

FIG. 12 shows a cross section of selective silicon plug 33 grown by a selective silicon plug manufacturing process. Referring to the FIG. 12, a single crystal silicon 35a is selectively grown on the surface of the silicon substrate and at the same time, a polycrystalline silicon 35b is grown on both silicon layers 33a. Then, the two are combined to fill up the contact hole.

FIGS. 13 to 17 are cross sectional views showing the steps of a method of manufacturing a semiconductor device according to another embodiment of the present invention.

Figure 13:
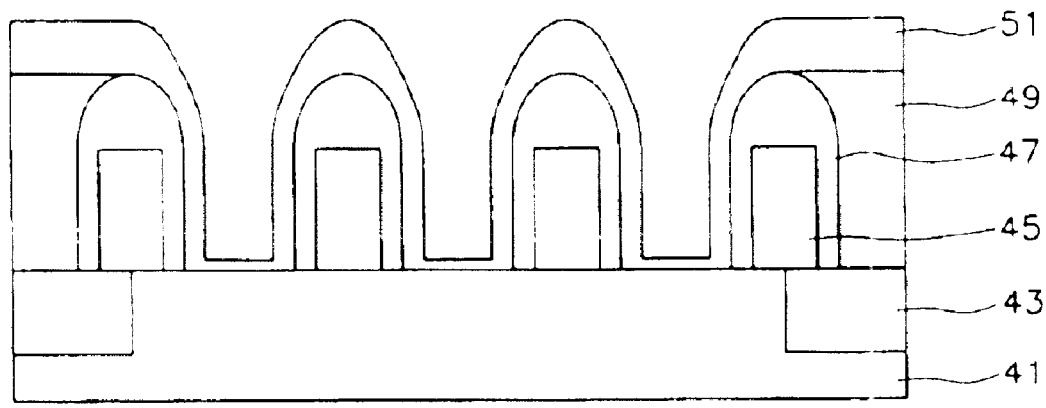
FIGS. 13 to 17 are cross sectional views showing the steps of a method of manufacturing a semiconductor device according to another embodiment of the present invention.

Referring to FIG. 13, a trench isolation layer 43 is formed on a silicon substrate 41 to define a device formation region and device isolation region.

A gate insulating layer (not shown) and a gate structure 45 are then formed on the device formation region of the silicon substrate 41 and a nitride layer (not shown) is deposited on the upper part of the silicon substrate 41, including over the gate structure 45. Subsequently, the nitride layer is selectively removed by using an anisotropic etch process, retaining the nitride layer on the upper part and side part of the gate structure 45, thereby forming an insulating layer spacer 47.

Although it is not shown in the drawings, an impurity junction region (not shown) is formed by implanting impurities on the lower part of both sides of the insulating layer spacer 47 on the silicon substrate 41.

Subsequently, an insulating layer 49 is deposited on the upper part of resulting structure, including over the insulating layer spacer 47, and then the layer 49 is selectively patterned to form a contact hole (not shown) exposing the silicon substrate 41 on the lower part of the insulating layer spacer 47.

Then, a PE-USG oxide layer 51 is deposited to a thickness of between 300 and 1000 Å on the upper part of resulting structure, including over the insulating layer spacer 47. Here, step coverage is required to be maintained below 50%. The source gas of the PE-USG oxide layer 51 is one or more gas taken from the group comprising SiH4, N$_2$O and He, and is at a pressure of between 0.1 to 50 Torr, a temperature of between 350 to 550° C., and at a power of between 100 to 1000W.

It is possible to reduce losses of the gate hard mask by forming the PE-USG oxide layer 51 on the gate structure 45.

Figure 14:
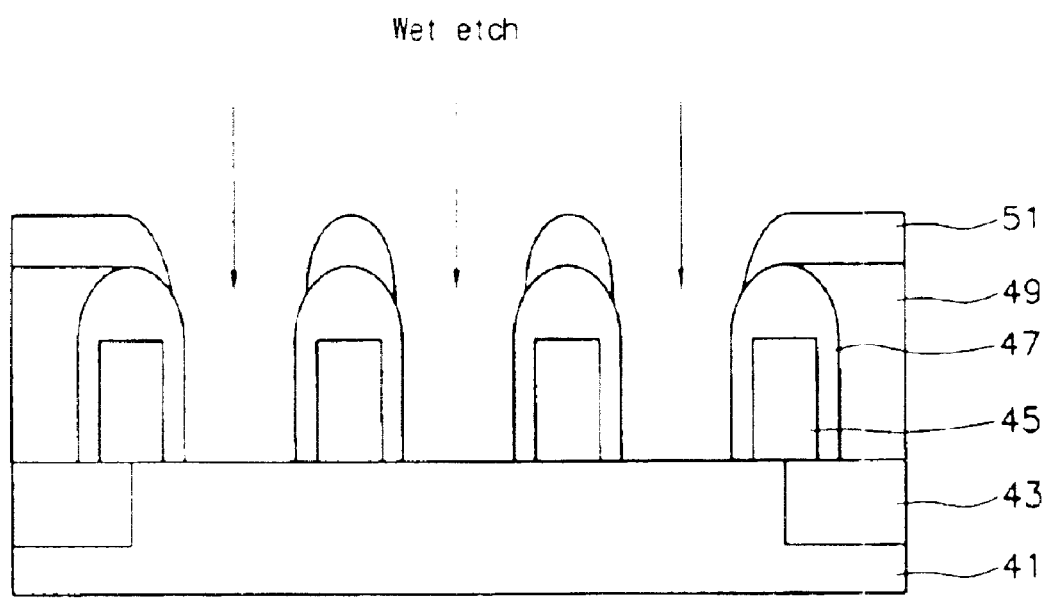

Referring to FIG. 14, the PE-USG oxide layer 51 is selectively removed by using a wet etch process, retaining the oxide layer 51 on the upper parts of the nitride layer spacer 47 to a depth of between 200 and 400 Å, and thereby exposing the surface of the silicon substrate 41 between the nitride layer spacer 47. The etch process of the PE-USG oxide layer 51 is performed at a temperature of between 50 and 100° C. in distilled water (DI) and repeated for between 50 and 500 times by using a diluted HF solution. For example, when a PE-USG layer having step coverage of 50% is deposited to a thickness of 600 Å, the wet etch target is between 300 to 400 Å.

Then, although it is not shown in the drawings, an in-situ cleaning process is performed prior to the deposition of the amorphous silicon layer. The in-situ cleaning process is performed to remove the oxide layer on the substrate interface by raising the temperature to render it in a state of hydrogen flow.

It is desirable to perform the cleaning process by using a Rapid Thermal Processing (RTP) method in consideration of processing time and thermal budget. The RTP method is performed by instantaneously raising the temperature to 950° C. (the ramping rate being over 10° C./sec) and then, rapidly cooling the temperature of the silicon deposition, that is, to a temperature between 550 and 630° C.

Figure 15:
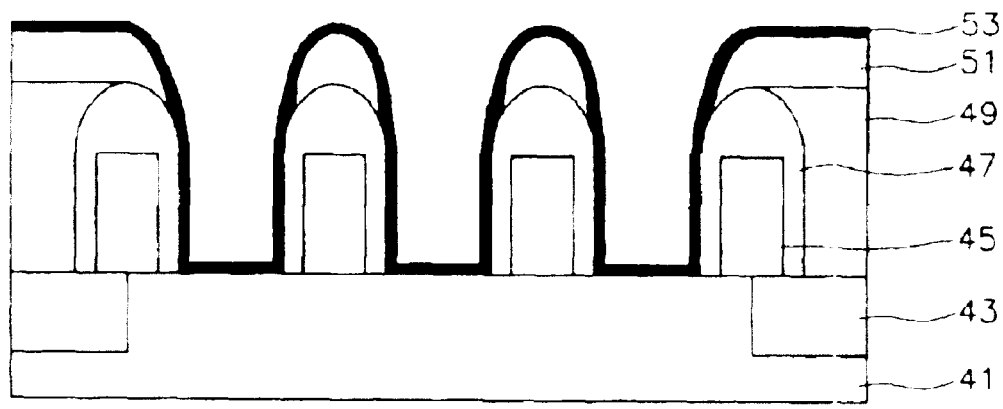

Referring to FIG. 15, an amorphous silicon layer 53 is deposited on the upper part of the resulting structure. The deposition of the amorphous silicon layer 53 is performed by using either SiH$_4$ or H$_2$ as a processing gas.

When the amorphous silicon layer 53 is deposited in a chamber for single wafer process, SiH$_4$ and Si$_2$H$_6$ are supplied at a flowrate of between 0.1 and 1.0 slm and H$_2$ is supplied at a flowrate of between 1 and 25 slm, the pressure is between 1 and 100 Torr, and the temperature is between 550 and 630° C.

In a tube system, the flow rate of SiH$_4$ is approximately between 0.1 and 2.0 slm and the flowrate of H$_2$ is between 1 and 20 slm, the pressure is between 1 and 10 Torr, and the temperature is between 520 and 610° C. The silicon doping concentration is approximately 1 and 2×10$^{20}$ atom/cc.

Figure 16:
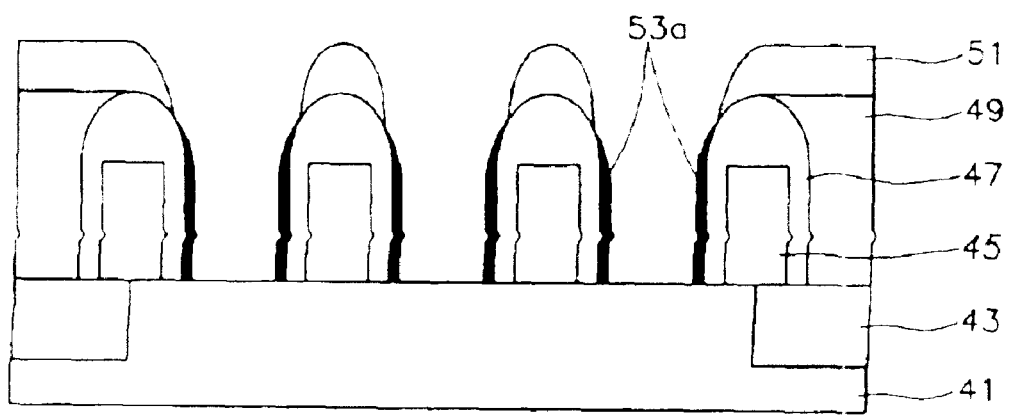

Referring to FIG. 16, a RIE etch process is performed to remove the doped amorphous silicon layer on the exposed surface of the PE-USG layer 51.

Then, prior to the contact plug growth process, the interface of the silicon substrate is cleaned by performing an in-situ cleaning process. The in-situ cleaning process is performed at the same temperature as that in the plug deposition by using an in-situ vacuum cleaning process or H$_2$ baking process, in order to remove natural oxide layers. If the cleaning process is not completely performed, it is possible to lose selectivity on the oxide layer and generate defects during the SEG growth.

Figure 17:
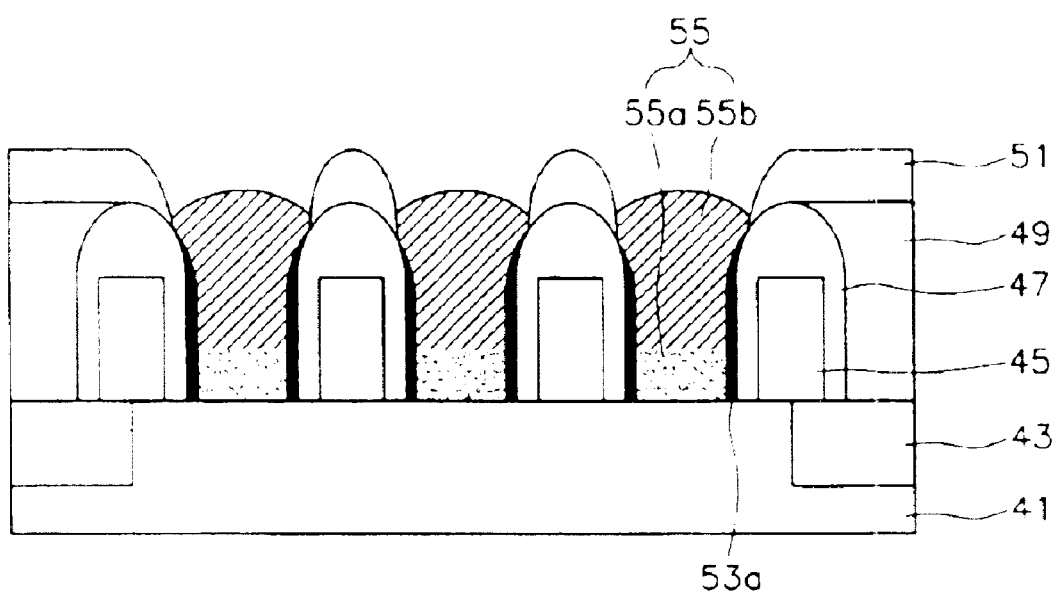

Referring to FIG. 17, a selective silicon plug 55 is formed in the contact hole (not shown), including over the exposed surface of the silicon substrate 41. The silicon plug 55 is deposited by using a LPCVD or ultrahigh vacuum-chemical vapor deposition (UHV-CVD) method. In the SEG deposition process, the incubation thickness is a maximum thickness of the SEG at which silicon nucleation is generated, generally between 800 and 1200 Å.

The thickness of SEG is increased by adding $Cl_2$ gas, however, the growth speed is lowered.

Therefore, according to the UHV-CVD method, $Cl_2$ is added in order to increase the process margin since a maximum growth speed is realized by using the thickness of incubation.

The selective silicon plug 55 is deposited by using a $Si_2H_6+Cl_2+H_2$ system, wherein the flow rate thereof is between 1 and 10 sccm and up to 20 sccm, respectively.

And, the deposition process is performed in-situ by using $H_2$ gas including between 1 and 10% $PH_3$ at a temperature of between 600 and 800° C. and at a pressure of between 1 and 50 mTorr.

In order to improve selectivity on the PE-USG oxide layer and increase the growth speed, $GeH_4$ may be added during deposition of the selective silicon plug 55. The $GeH_4$ is desirably flowed at between 0 and 10 sccm and the growth thickness of the SSG plug is between 60 and 100% of the width of the contact hole (not shown).

As described above, the PE-USG oxide layer is formed on the upper part of the nitride layer spacer and silicon is formed on the side thereof. Therefore, selectivity margin is improved and the growth speed of plug is increased.

It is therefore possible to simplify the manufacturing process by increasing the growth speed of the silicon on the side of the nitride layer spacer.

And, compared with a tube polycrystalline silicon plug, it is also possible to remarkably reduce the plug contact resistance since the plug is formed by using a SEG process.

Moreover, according to the present invention, the growth speed of the silicon is increased on the sidewall silicon layer, thereby reducing the growth target of the selective silicon plug. Therefore, the processing time is also reduced.

According to the present invention, facet generation is reduced by the silicon growth from the silicon layer.

The height of mask nitride layer is also lowered by the PE-USG oxide layer on the gate structure, thereby improving the SAC process.

There is no problem of contact hole fill and bridge since there is not much possibility of overgrowth.

When the UHV-CVD method is applied to the present invention, the growth thickness of silicon is reduced to increase productivity. As a result, it is possible to optimize the low thermal budget process.

Moreover, the present invention has economic advantages of minimizing the silicon source for gap fill.

Although the preferred embodiment of this invention has been disclosed for illustrative purpose, those skilled in the art will appreciate that various modifications, alterations, additions and substitutions are possible, without departing from the scope and spirit of the invention.

What is claimed is:

1. A method of manufacturing a semiconductor device comprising the steps of:
   forming a gate structure on a silicon substrate;
   forming an insulating layer on the gate structure;
   forming an oxide layer on the insulating layer of the gate structure;
   forming an insulating layer on the silicon substrate;
   forming a contact hole in the insulating layer;
   forming a silicon layer on a surface of the contact hole; and
   forming a selective conductive plug in the contact hole having the silicon layer.

2. The method of manufacturing a semiconductor device according to claim 1, wherein the oxide layer includes PE-USG oxide layer.

3. The method of manufacturing a semiconductor device according to claim 2, wherein the PE-USG oxide layer is formed by using $SiH_4$ as a source gas and by combining $N_2O$ or $O_2$ therewith.

4. The method of manufacturing a semiconductor device according to claim 3, wherein the PE-USG oxide layer is deposited under the conditions that the flow rate of $SiH_4$ is between 10 and 200 sccm, that the flowrate of $N_2O$ and $O_2$ is between 100 and 3000 sccm, the flowrate of $H_2$ is between 0 and 1000 sccm, the pressure is between 0.1 and 50 Torr, the temperature is between 350 and 550°, and the power is between 100 and 1000W.

5. The method of manufacturing a semiconductor device according to claim 2, wherein the PE-USG oxide layer has a thickness of between 300 and 1000 Å and step coverage is below 50%.

6. The method of manufacturing a semiconductor device according to claim 1, wherein the step of forming the oxide layer on the insulating layer on the gate structure further comprises the steps of:
   forming an oxide layer on the insulating layer including the contact hole; and
   selectively removing the oxide layer by using a wet etch process.

7. The method of manufacturing a semiconductor device according to claim 6, wherein the oxide layer remains at a thickness of between 200 and 400 Å after the wet etch process.

8. The method of manufacturing a semiconductor device according to claim 1, wherein the insulating layer on the gate structure is a nitride layer.

9. The method of manufacturing a semiconductor device according to claim 1, wherein the silicon layer is a doped amorphous silicon layer.

10. The method of manufacturing a semiconductor device according to claim 9, wherein an in-situ cleaning process is performed prior to forming the doped amorphous silicon layer.

11. The method of manufacturing a semiconductor device according to claim 10, wherein the in-situ cleaning process is performed by using a RTP process.

12. The method of manufacturing a semiconductor device according to claim 9, wherein the doped amorphous silicon layer is deposited by using $SiH_4$ and $H_2$ gas, and the doping concentration of silicon is between 1 and $2 \times 10^{20}$ atom/cc.

13. The method of manufacturing a semiconductor device according to claim 9, wherein the doped amorphous silicon layer is formed on the bottom of the contact hole and side thereof, or only on the side thereof.

14. The method of manufacturing a semiconductor device according to claim 13, wherein the doped amorphous silicon layer is removed from the surface of the substrate insulating layer, except from the bottom of contact hole and the sides thereof, by an etch process using HCl and under the conditions that the flow rate of HCl is between 0.1 and 1.0 slm, and a flowrate of $H_2$ is between 1 and 10 slm, the pressure is between 10 and 500 Torr, and the temperature is between 750 and 950° C.

15. The method of manufacturing a semiconductor device according to claim 14, wherein the removal of the doped amorphous silicon layer comprises the steps of removing the doped amorphous silicon layer on the substrate insulating layer and on the bottom of the contact hole by using a dry etch process.

16. The method of manufacturing a semiconductor device according to claim 1, wherein the silicon layer is an amorphous silicon layer having a thickness of between 50 and 150 Å.

17. The method of manufacturing a semiconductor device according to claim 1, wherein the selective conductive plug is deposited in an UHV-CVD device for single wafer process and in a tube type UHV-CVD device for SEG.

18. The method of manufacturing a semiconductor device according to claim 17, wherein $GeH_4$ gas is flowed at a rate of between 0 and 10 sccm in deposition of the selective conductive plug.

19. A method of manufacturing a semiconductor device comprising the steps of:

forming a gate structure on a silicon substrate; forming an insulating layer on the gate structure; forming an oxide layer on the insulating layer of the gate structure;

forming an insulating layer on the silicon substrate;

forming a contact hole in the insulating lever;

forming a silicon layer on a surface of the contact hole; and forming a selective conductive plug in the contact hole having the silicon layer, wherein the selective conductive plug is formed by growing a selective single crystal silicon and a selective polycrystalline silicon by using a LPCVD method or a UHVCVD method.

20. The method of manufacturing a semiconductor device according to claim 19, wherein a Si—H—Cl system is first used with the LPCVD method and a dichlorosilane $H_2$—HCl or methylsilane-$H_2$—HCl gas system is then used.

21. The method of manufacturing a semiconductor device according to claim 20, wherein the dichlorosilane-$H_2$—HCl gas system is applied under the conditions of temperature between 750 and 950° C., the pressure between 5 and 150 Torr, the flow rate of dichlorosilane between 0.1 and 1 slm, the flowrate of HCl between 0.1 and 1.0 slm, and the flowrate of $H_2$ between 30 and 150 slm.

22. The method of manufacturing a semiconductor device according to claim 20, wherein the methylsilane-$H_2$—HCl gas system is applied under the conditions of temperature between 750 and 950° C., the pressure between 5 and 150° C. Torr, the flow rate of methylsilane between 0.1 and 1 slm, the flowrate of HCl between 0.5 and 5.0 slm, and the flowrate of $H_2$ between 30 and 150 slm.

23. The method of manufacturing a semiconductor device according to claim 19, wherein the UHVCVD method is applied under the conditions that a H baking process or RTP cleaning process is performed at a temperature of between 850 and 950° C. for 1 to 5 minutes, prior to forming the selective silicon plug.

24. The method of manufacturing a semiconductor device according to claim 19, wherein the selective conductive plug is deposited by using a $SiH_6+Cl_2+H_2$ system under the conditions that the flow rate thereof is between 1 and 10 sccm and up to 20 sccm, respectively, using $H_2$ which includes about 10% $PH_3$ in-situ at a temperature of between 600 and 800° C. and a pressure of between 1 and 50 Torr.

* * * * *